United States Patent
Vlemmings

(10) Patent No.: US 8,032,105 B2
(45) Date of Patent: Oct. 4, 2011

(54) MULTISTAGE FREQUENCY CONVERSION

(75) Inventor: Marc Lambertus Johannes Vlemmings, Eindhoven (NL)

(73) Assignee: NXP B.V., Eindhoven (NL)

( * ) Notice: Subject to any disclaimer, the term of this patent is extended or adjusted under 35 U.S.C. 154(b) by 1490 days.

(21) Appl. No.: 10/555,270

(22) PCT Filed: Apr. 29, 2004

(86) PCT No.: PCT/IB2004/050552
§ 371 (c)(1),
(2), (4) Date: Nov. 1, 2005

(87) PCT Pub. No.: WO2004/100355
PCT Pub. Date: Nov. 18, 2004

(65) Prior Publication Data
US 2007/0037543 A1    Feb. 15, 2007

(30) Foreign Application Priority Data
May 5, 2003 (EP) .................................... 03101243

(51) Int. Cl.
*H04B 1/26* (2006.01)
(52) U.S. Cl. .................... 455/323; 455/76; 455/118
(58) Field of Classification Search .................... 455/323
See application file for complete search history.

(56) References Cited

U.S. PATENT DOCUMENTS

| | | | | |
|---|---|---|---|---|
| 6,087,865 A * | 7/2000 | Bradley | ................. | 327/117 |
| 6,144,846 A * | 11/2000 | Durec | ................. | 455/323 |
| 6,282,413 B1 * | 8/2001 | Baltus | ................. | 455/260 |
| 6,678,503 B1 * | 1/2004 | Black et al. | ................. | 455/76 |
| 7,327,406 B2 * | 2/2008 | Utsunomiya et al. | ......... | 348/731 |
| 2002/0186713 A1 | 12/2002 | Brunel | | |
| 2002/0193068 A1 | 12/2002 | Sepehry-Fard | | |
| 2003/0219067 A1 | 11/2003 | Birkett et al. | | |
| 2004/0116087 A1 * | 6/2004 | Shen | ................. | 455/130 |
| 2006/0205374 A1 * | 9/2006 | Darabi et al. | ................. | 455/259 |

FOREIGN PATENT DOCUMENTS

| | | |
|---|---|---|
| EP | 1 289 123 A | 3/2003 |
| WO | 01/39364 A1 | 5/2001 |
| WO | 02/060058 | 8/2002 |

OTHER PUBLICATIONS

Leong, J. et al. "A 2.7-V 900-MHz/1/9 GHz Dual-Band Transceiver IC for Digital Wireless Communication", IEEE J. of Solid-State Circuits, vol. 34, No. 3, pp. 286-291 (Mar. 1999).

* cited by examiner

*Primary Examiner* — Duc Nguyen
*Assistant Examiner* — Ajibola Akinyemi

(57) ABSTRACT

A receiver for frequency down converting a radio frequency signal (10) using a multistage frequency (down) conversion. The radio frequency signal (10) having a center frequency that is comprised in one of at least two frequency bands, comprises oscillating means (20) for generating a first mixing signal (11) having a first frequency. And also a frequency divider (22) arranged to derive a second mixing signal (13) from the first mixing signal. The receiver further comprising a first mixer (12) arranged to down-convert the radio frequency signal (10) to a first lower frequency signal (15) using the first mixing signal (11) and a second mixer arranged to down-convert the first low frequency signal to a second lower frequency signal (18) using the second mixing signal (13). Wherein the division factor of the frequency divider and a ratio between the center frequency and the first frequency are determined by the one of at least two frequency bands. Similarly a transmitter can transmit a radio frequency signal (53) by using multistage frequency (up) conversion.

12 Claims, 2 Drawing Sheets

| Frequency[MHz] | Allocation |
|---|---|
| 4900 - 5000 | Japan |
| 5150 - 5350 | USA WLAN, EU Hiperlan2 |
| 5470 - 5825 | EU Hiperlan2 |
| 5725 - 5825 | USA WLAN |
| 5825 - 5925 | Automotive Telematics USA |
Fig.1
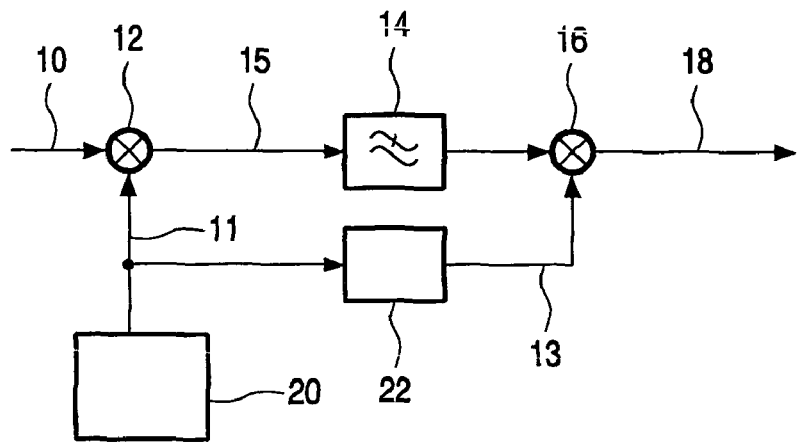
Fig.2
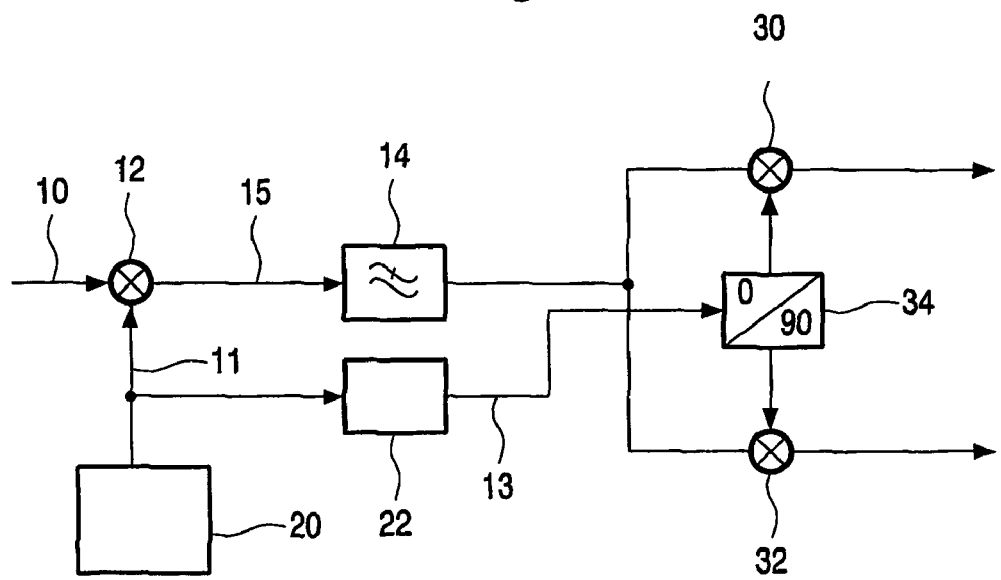
Fig.3

MULTISTAGE FREQUENCY CONVERSION

The present invention relates to a receiver using multistage frequency conversion. The invention further relates to a transmitter using multistage frequency conversion and to a transceiver comprising such a receiver and transmitter. The invention also relates to a method for multistage frequency conversion of a radio frequency signal.

A receiver using multistage frequency conversion is known from the U.S. Pat. No. 6,282,413 B1. Shown is a receiver for down-converting a radio frequency signal using two separate frequency down conversion stages. Each of those stages is comprising a mixer. The corresponding mixing signals used by those mixers are generated by a tunable oscillator. However, since the tuning range of such a tunable local oscillator is limited per se, the corresponding receiving bandwidth i.e. the bandwidth from which the receiver can receive signals, is also limited To this end, the receiver for receiving a radio frequency signal having a center frequency that is comprised in one of at least two frequency bands, comprising:
  oscillating means for generating a first mixing signal having a first frequency;
  a frequency divider arranged to derive a second mixing signal from the first mixing signal;
  a first mixer arranged to down-convert the radio frequency signal to a first lower frequency signal using the first mixing signal; and
  a second mixer arranged to down-convert the first low frequency signal to a second lower frequency signal using the second mixing signal;
  in which a division factor of the frequency divider and a ratio between the center frequency and the first frequency are determined by the one of at least two frequency bands.

In the invention as claimed, the ratio between the frequency of the first mixing signal and the center frequency such as a carrier frequency, is determined by the frequency band comprising the center frequency. According to the present invention the oscillating means are arranged to generate the first mixing signal. The second mixing signal is derived from the first signal by using a frequency divider which has a division factor that is also determined by the frequency band comprising the center frequency. Therefore, the frequencies of the mixing signals are no longer fixed but are made variably dependent on the center frequency. Herewith the receiving bandwidth can advantageously be increased without having to increase the corresponding tuning range of the oscillating means. In addition, given a certain receiving bandwidth the present invention can advantageously be used for reducing the tuning range of the oscillating means without reducing the receiving bandwidth as such.

In a further embodiment according to the present invention the receiver is comprising a phase shifter to shift the phase of the second mixing signal which can be used for the down-conversion of quadrature signals such as I-Q signals.

These and other aspects of the invention win be further elucidated by means of the following drawings.

FIG. 1 shows some examples of frequency ranges that are used for wireless LAN applications.

FIG. 2 shows a first embodiment of a receiver according to the present invention.

FIG. 3 shows a second embodiment of a receiver according to the present invention.

Figure 4:
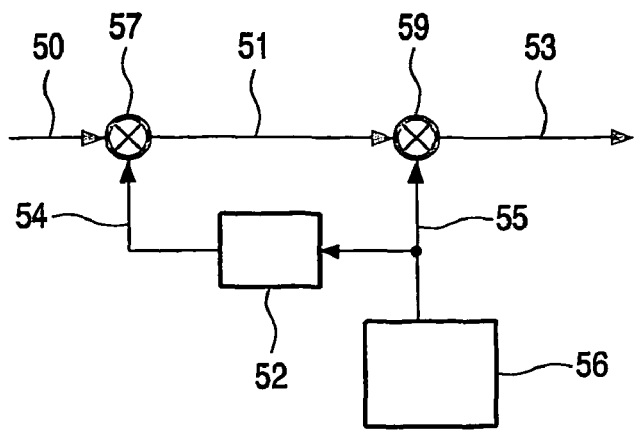
FIG. 4 shows an embodiment of a transmitter according to the present invention.

FIG. 1 shows by means of example some frequency bands used with wireless LAN applications. As can be observed, some frequency bands are adjacent to others. See for example, USA WLAN and the frequency band for Automotive Telematics in the USA.

FIG. 2 shows a receiver according to the present invention. Shown are first and second mixers 12 and 16 which are coupled via low-pass filter 14 for removing unwanted spectral components from the first lower frequency signal 15. The receiver further comprises oscillating means 20 which may comprise a PLL or a free running oscillator for generating the first mixing signal. The embodiment further comprises frequency divider 22 for deriving the second mixing signal 13 from the first mixing signal 11. Both the division factor of the frequency divider and the ratio between the frequency of the first mixing signal 11 and the center frequency are dependent on the frequency band comprising the center frequency. It is to be noted that the wording center frequency also comprises a carrier frequency. The achievable reduction in tuning range is illustrated below. By means of example, the frequency of the first mixing signal 11 has a ratio of $N/(N+1)$ to the carrier frequency. The frequency divider 22 has a division factor N. Therefore, the frequency of the second mixing signal equals $1(N+1)$ times the center frequency. N can assume any integer number For $N=2$, the first mixing signal would have a frequency of $2/3$ times the center frequency whilst the second mixing signal would have a frequency of $1/3$ times the center frequency. In table 1, the tuning range is calculated for different values of N. Nevertheless, N is fixed for the entire receiving bandwidth that ranges from 4900 to 5925 MHz. The tuning range of the osciliating means 20 is expressed in terms of a relative bandwidth (%) which can be calculated as:

(Fmax−Fmin)/((Fmax+Fmin)/2)*100%.

TABLE 1

Tuning range for fixed N.

| Center frequency (MHz) | N | 1$^{st}$ mixing signal (MHz) | Tuning range (%) |
|---|---|---|---|
| 4900-5925 | 2 | 3267-3950 | 18.9 |
| 4900-5925 | 3 | 3675-4444 | 18.9 |
| 4900-5925 | 4 | 3920-4740 | 18.9 |

In table 2, the value of N is made dependent on the frequency band comprising the center frequency.

TABLE 2

Tuning range for variable N.

| Center frequency (MHz) | N | 1$^{st}$ mixing signal (MHz) | Tuning range (%) |
|---|---|---|---|
| 4900-5266 | 3 | 3675-3950 | 11.5 |
| 5267-5925 | 2 | 3511-3950 | |

In this case the oscillator means 20, only need to cover the frequency range from 3511 to 3950 MHz. This represents a tuning range of 11.8% which is about 1.5 times lower compared to the first situation. Although in the above example the ratio between the first frequency and the center frequency equals $N/(N+1)$, other ratio's and division factors are equally possible. For a zero-IF receiver for example, a ratio of $N/(N-$ 1) between the frequency of the first mixing signal 11 and the center frequency of the input signal 10 can be used as well. In this case, by using frequency divider 22 having a division factor N, the frequency of the second mixing signal 13 becomes 1/(N−1) times the center frequency. In general, for zero-IF, the sum of the frequencies of the mixing signals 11 and 13 must equal the center frequency. For non-zero IF however, the ratio and the division factor should be chosen such that the sum of the frequencies of mixing signals 11 and 13 does not equal the center frequency.

FIG. 3 shows an embodiment of a receiver according to the present invention wherein mixers 30 and 32 are used for down-converting quadrature signals for use in for example I-Q demodulators. In order to down-convert the quadrature signals the receiver comprises a phase shifter 34 for shifting the phase of the second mixing signal.

FIG. 4 shows an embodiment of a transmitter according to the present invention. Shown are mixers 57 and 59 for up-converting lower frequency signal 10 to a radio frequency signal 53. To this end, mixers 57 and 59 make use of mixing signals 54 and 55. Mixing signal 54 is derived from mixing signal 55 using frequency divider 61 which has a programmable division factor. Mixing signal 55 is generated using oscillating means 56 which can e.g. be PLL based or can make use of a free running oscillator. The division factor of the frequency divider 61 and the ratio between the frequency of the mixing signal 55 and the center frequency of signal 53 are equally determined by the frequency band comprising the center frequency.

Figure 5:
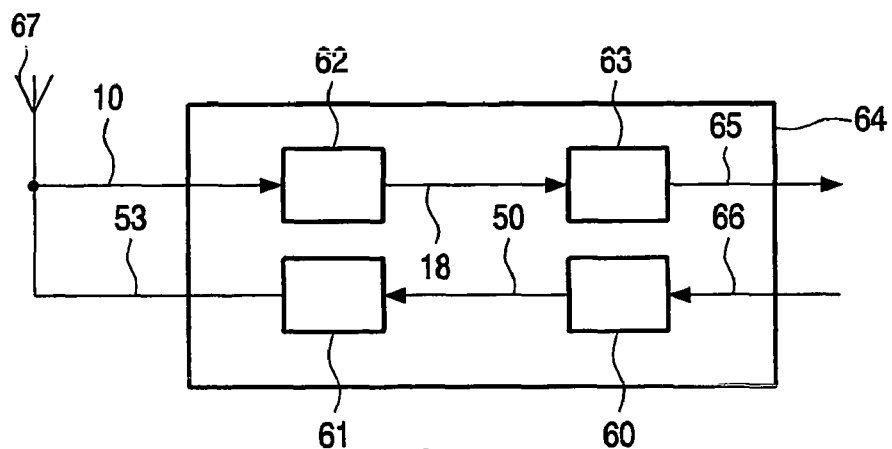
FIG. 5 shows an embodiment of a transceiver according to the present invention

FIG. 5 shows a transceiver 64 comprising transmitter 61 and receiver 62. Receiver 62 receives input signal 10 from antenna 67 and frequency down-converts the input signal 10 to the lower frequency signal 18 which can be either a zero-IF or a near zero-EF signal. Signal 65 is obtained from the lower frequency signal 18 after being processed in processing means 63. Processing means 60, process signal 66 into the lower frequency signal 50. This signal is subsequently frequency up-converted by means of transmitter 61 and transmitted through antenna 67.

Figure 6:
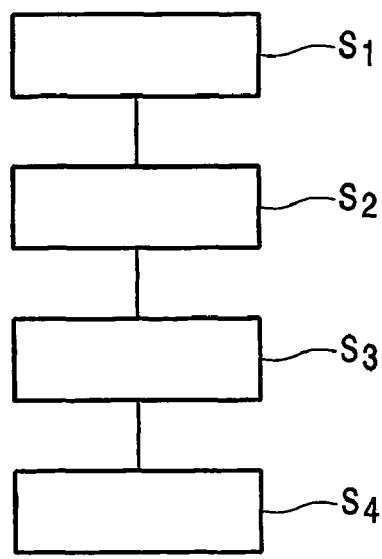
FIG. 6 shows a flowchart showing the steps for multistage frequency conversion according to the present invention.

FIG. 6 shows a flowchart comprising four steps S1,S2,S3 and S4 for frequency down converting a signal 10 using multistage frequency conversion. In step S1 a first mixing signal 11 is generated having a ratio to the center frequency, which ratio is determined by the one of at least two frequency bands that is comprising the center frequency. In step S2 a second mixing signal 13 is derived from the first mixing signal by using a frequency divider 22 having a division factor which is determined by the one of at least two frequency bands. In step S3, the radio frequency signal 10 is down-converted into a first lower frequency signal using the first mixing signal. Finally in step S4, the first lower frequency signal is frequency down-converted into a second lower frequency signal 18 using the second mixing signal 13.

It is to be noted that the above-mentioned embodiments illustrate rather than limit the invention, and that those skilled in the art will be able to design many alternative embodiments without departing from the scope of the appended claims. The embodiments can be realized in either the analogue or digital domain using analogue and digital components. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. Receiver for receiving a radio frequency signal (10) having a center frequency that is comprised in one of at least two frequency bands, the receiver comprising:
   oscillating means (20) for generating a first mixing signal (11) having a first frequency;
   a frequency divider (22) arranged to derive a second mixing signal (13) from the first mixing signal;
   a first mixer (12) arranged to down-convert the radio frequency signal (10) to a first lower frequency signal (15) using the first mixing signal (11); and
   a second mixer arranged to down-convert the first low frequency signal to a second lower frequency signal (18) using the second mixing signal (13);
   in which a division factor of the frequency divider and a ratio between the center frequency and the first frequency are determined by the one of at least two frequency bands, wherein the first frequency has a ratio of N/(N+1) or N/(N−1) to the center frequency, and wherein N is the division factor.

2. Receiver according to claim 1, wherein the receiver comprises a phase shifter (34) for shifting the phase of the second mixing signal (13).

3. Receiver according to claim 1, wherein frequencies of the first mixing signal and the second mixing signal are not fixed and are variably dependent on the center frequency of the radio frequency signal.

4. Transmitter for transmitting a radio frequency signal (53) having a center frequency that is comprised in one of at least two frequency bands, the transmitter comprising:
   oscillating means (56) for generating a second mixing signal (55) having a second frequency;
   a frequency divider arranged (52) to derive a first mixing signal (54) from the second mixing signal (55);
   a first mixer (57) arranged to up-convert a lower frequency signal (50) to a higher frequency signal using the first mixing signal (54); and
   a second mixer (59) arranged to up-convert the higher frequency signal (51) to a radio frequency signal (53) using the first second signal (55);
   in which a division factor of the frequency divider and a ratio between the center frequency and the first frequency are determined by the one of at least two frequency bands, wherein the first frequency has a ratio of N/(N+1) or N/(N−1) to the center frequency, and wherein N is the division factor.

5. Transmitter according to claim 4, wherein frequencies of the first mixing signal and the second mixing signal are not fixed and are variably dependent on the center frequency of the radio frequency signal.

6. Transceiver comprising a receiver (62) that is capable of receiving a radio frequency signal (10) having a center frequency that is comprised in one of at least two frequency bands, the receiver (62) comprising:
   oscillating means (20) for generating a first mixing signal (11) having a first frequency;
   a frequency divider (22) arranged to derive a second mixing (13) signal from the first mixing signal (11);
   a first mixer (12) arranged to down-convert the radio frequency signal (10) to a first lower frequency signal (15) using the first mixing signal (11); and
   a second mixer (16) arranged to down-convert the first low frequency signal (15) to a second lower frequency signal (18) using the second mixing signal (13);
   in which a division factor of the frequency divider and a ratio between the center frequency and the first frequency are determined by the one of at least two frequency bands, wherein the first frequency has a ratio of N/(N+1) or N/(N−1) to the center frequency, and wherein N is the division factor.

7. Transceiver according to claim 6, comprising a transmitter (61) that is capable of transmitting a second radio frequency (53) signal having a second center frequency that is comprised in one of the at least two frequency bands, the transmitter comprising:
a third mixer (57) arranged to up-convert a lower frequency signal to a higher frequency signal using a third mixing signal (54) having a third frequency; and
a fourth mixer (59) arranged to up-convert the higher frequency signal (51) to the radio frequency signal (53) using a fourth mixing signal (55).

8. Transceiver according to claim 7, wherein the oscillating means (20,56) are further arranged to generate the fourth mixing signal (55) having a third frequency and the transceiver further comprises a second frequency divider (52) for deriving the third mixing signal (54) from the fourth mixing signal (55), in which a second division factor of the second frequency divider and a second ratio between the second center frequency and the third are determined by the one of at least two frequency bands.

9. Transceiver according to claim 8, wherein the first mixing signal (11) equals the third mixing signal (54) and the second mixing signal (13) equals the fourth mixing signal (55).

10. Transceiver according to claim 6, wherein frequencies of the first mixing signal and the second mixing signal are not fixed and are variably dependent on the center frequency of the radio frequency signal.

11. Method for receiving a radio frequency signal (10) having a center frequency that is comprised in one of at least two frequency bands, the method comprising the steps of:
generating a first mixing signal (11) that has a ratio to the center frequency, which ratio is determined by the one of at least two frequency bands;
deriving a second mixing signal (13) from the first mixing signal by using a frequency divider (22) having a division factor which is determined by the one of at least two frequency bands comprising the center frequency;
down-converting the radio frequency signal to a first lower frequency signal (15) using the first mixing signal (11); and
down-converting the first lower frequency signal (15) to a second lower frequency signal (18) using the second mixing signal (13),
wherein the first frequency has a ratio of N/(N+1) or N/(N−1) to the center frequency, and wherein N is the division factor.

12. Method according to claim 11, wherein frequencies of the first mixing signal and the second mixing signal are not fixed and are variably dependent on the center frequency of the radio frequency signal.

* * * * *